US011263573B2

(12) United States Patent
Sogawa et al.

(10) Patent No.: US 11,263,573 B2
(45) Date of Patent: Mar. 1, 2022

(54) DEGRADATION PREDICTION APPARATUS, DEGRADATION PREDICTION METHOD, AND COMPUTER-READABLE RECORDING MEDIUM

(71) Applicant: NEC Corporation, Tokyo (JP)

(72) Inventors: Yasuhiro Sogawa, Tokyo (JP); Nobuhiro Mikami, Tokyo (JP)

(73) Assignee: NEC CORPORATION, Tokyo (JP)

( * ) Notice: Subject to any disclaimer, the term of this patent is extended or adjusted under 35 U.S.C. 154(b) by 157 days.

(21) Appl. No.: 16/497,858

(22) PCT Filed: Mar. 31, 2017

(86) PCT No.: PCT/JP2017/013718
§ 371 (c)(1),
(2) Date: Sep. 26, 2019

(87) PCT Pub. No.: WO2018/179376
PCT Pub. Date: Oct. 4, 2018

(65) Prior Publication Data
US 2020/0027044 A1     Jan. 23, 2020

(51) Int. Cl.
*G06Q 10/06* (2012.01)
*G06F 30/20* (2020.01)
(Continued)

(52) U.S. Cl.
CPC ....... *G06Q 10/06375* (2013.01); *E01D 22/00* (2013.01); *G06F 30/20* (2020.01);
(Continued)

(58) Field of Classification Search
CPC .. G06Q 10/06375; G06Q 50/08; G06F 30/20; E01D 22/00; G06N 7/005
(Continued)

(56) References Cited

U.S. PATENT DOCUMENTS

2007/0239368 A1* 10/2007 Marrano ................ G06Q 10/06
702/34
2014/0330609 A1* 11/2014 Candas ............ G06Q 10/06313
705/7.23

FOREIGN PATENT DOCUMENTS

JP     2002-304213 A    10/2002
JP     2005-17157 A      1/2005
(Continued)

OTHER PUBLICATIONS

NCHRP_2007 (NCHRP Synthesis 375 Bridge Inspection Practices, Transportation Research Board, 2007). (Year: 2007).*
(Continued)

*Primary Examiner* — Brian S Cook
(74) *Attorney, Agent, or Firm* — Sughrue Mion, PLLC

(57) ABSTRACT

In order to supplement results of diagnosis of degradation of an object that has been implemented at set intervals using a degradation progression model for simulating the progression of degradation of the object, a degradation prediction apparatus 100 is provided with: a data generation unit 112 configured to generate, as supplement data, diagnosis results that would be obtained if the degradation diagnosis were performed at an interval shorter than the set interval; a prediction model generation unit 113 configured, using the supplement data, to generate a prediction model for predicting a degradation index indicating a degradation state of the object at a specific point in time; and a degradation index prediction unit 114 configured to predict the degradation index of the object based on the prediction model.

6 Claims, 10 Drawing Sheets

(51) Int. Cl.
*E01D 22/00* (2006.01)
*G06N 7/00* (2006.01)
*G06Q 10/00* (2012.01)
*G06Q 50/08* (2012.01)

(52) U.S. Cl.
CPC ............ *G06N 7/005* (2013.01); *G06Q 10/20* (2013.01); *G06Q 50/08* (2013.01)

(58) Field of Classification Search
USPC .......................................................... 703/6
See application file for complete search history.

(56) References Cited

FOREIGN PATENT DOCUMENTS

| JP | 2006-177080 A | 7/2006 |
|---|---|---|
| JP | 2006-323741 A | 11/2006 |
| JP | 2009-192221 A | 8/2009 |
| WO | 2016/163003 A1 | 10/2016 |

OTHER PUBLICATIONS

International Search Report in International Application No. PCT/JP2017/013718, dated Jun. 27, 2017.

Kiyoyuki Kaito, et al., "Bayesian Estimate of Markov Degradation Hazard Model", Proceeding of the Japan Society of Civil Engineers A, 2007, vol. 63, No. 2, pp. 336-355 (20 pages total).

Yu Otake, et al., "Statistical study on evaluation bridge health degree based on bridge inspection database", Journal of the Japan Society of Civil Engineers A2, 2011, vol. 67, No. 2, pp. 813-824 (12 pages total).

East Japan Expressway Co., Ltd., "Maintenance Inspection Procedures", Structure Edition, NEXCO Research Institute, Apr. 2015 (10 pages total).

* cited by examiner

Fig.3

LEARNING DATA

| STRUCTURE ID | YEAR | INSPECTION RECORD | | ... | SERVICE ENVIRONMENT INFORMATION | | ... | SOUNDNESS LEVEL |
|---|---|---|---|---|---|---|---|---|
| | | DAMAGE A | DAMAGE B | | AVERAGE DAILY TRAFFIC VOLUME | AMOUNT OF SNOW MELTING AGENT DISTRIBUTED | | |
| 1 | 1991 | $0.1m^2$ | $0.2m^2$ | ... | 30,000 VEHICLES | 700kg | ... | II |
| | 1996 | $0.1m^2$ | $0.3m^2$ | ... | 40,000 VEHICLES | 1,400kg | ... | II |
| | ⋮ | ⋮ | ⋮ | ⋮ | ⋮ | ⋮ | ⋮ | ⋮ |
| | 2016 | $0.8m^2$ | $1.5m^2$ | ... | 50,000 VEHICLES | 1,500kg | ... | III |
| 2 | 1993 | $0.1m^2$ | $0.2m^2$ | ... | 20,000 VEHICLES | 600kg | ... | II |
| | ⋮ | ⋮ | ⋮ | ⋮ | ⋮ | ⋮ | ⋮ | ⋮ |
| | 2013 | $0.4m^2$ | $0.5m^2$ | ... | 15,000 VEHICLES | 1,300kg | ... | III |
| ⋮ | ⋮ | ⋮ | ⋮ | ⋮ | ⋮ | ⋮ | ⋮ | ⋮ |
| 100 | 1997 | $0m^2$ | $0m^2$ | ... | 20,000 VEHICLES | 0kg | ... | I |
| | ⋮ | ⋮ | ⋮ | ⋮ | ⋮ | ⋮ | ⋮ | ⋮ |

Fig.4

GENERATED DATA

| STRUCTURE ID | YEAR | INSPECTION RECORD | | ... | SERVICE ENVIRONMENT INFORMATION | | ... | SOUNDNESS LEVEL |
|---|---|---|---|---|---|---|---|---|
| | | DAMAGE A | DAMAGE B | | AVERAGE DAILY TRAFFIC VOLUME | AMOUNT OF SNOW MELTING AGENT DISTRIBUTED | | |
| 101 | 1991 | 0.1m² | 0.2m² | ... | 30,000 VEHICLES | 700kg | ... | II |
| | 1992 | | | ... | 40,000 VEHICLES | 1,400kg | ... | |
| | ⋮ | ⋮ | ⋮ | ⋮ | ⋮ | ⋮ | ⋮ | ⋮ |
| | 1996 | 0.3m² | 1.0m² | ... | 35,000 VEHICLES | 1,500kg | ... | III |
| | 1997 | | | ... | 50,000 VEHICLES | 1,500kg | ... | |
| | ⋮ | ⋮ | ⋮ | ⋮ | ⋮ | ⋮ | ⋮ | ⋮ |
| 102 | 2003 | 0.4m² | 0.5m² | ... | 20,000 VEHICLES | 600kg | ... | II |
| | ⋮ | ⋮ | ⋮ | ⋮ | ⋮ | ⋮ | ⋮ | ⋮ |
| | 2006 | | | ... | 15,000 VEHICLES | 1,300kg | ... | III |
| ⋮ | ⋮ | ⋮ | ⋮ | ⋮ | ⋮ | ⋮ | ⋮ | ⋮ |
| 200 | 2001 | 0m² | 0m² | ... | 20,000 VEHICLES | 0kg | ... | I |
| | ⋮ | ⋮ | ⋮ | ⋮ | ⋮ | ⋮ | ⋮ | ⋮ |

Fig.5

GENERATED DATA + NEWLY GENERATED DATA

| STRUCTURE ID | YEAR | INSPECTION RECORD | | | SERVICE ENVIRONMENT INFORMATION | | | SOUNDNESS LEVEL |
|---|---|---|---|---|---|---|---|---|
| | | DAMAGE A | DAMAGE B | ... | AVERAGE DAILY TRAFFIC VOLUME | AMOUNT OF SNOW MELTING AGENT DISTRIBUTED | ... | |
| 101 | 1991 | 0.1m² | 0.2m² | ... | 30,000 VEHICLES | 700kg | ... | II |
| | 1992 | 0.1m² | 0.2m² | ... | 40,000 VEHICLES | 1,400kg | ... | II |
| | ⋮ | ⋮ | ⋮ | ⋮ | ⋮ | ⋮ | ⋮ | ⋮ |
| | 1996 | 0.3m² | 1.0m² | | 35,000 VEHICLES | 1,500kg | ... | III |
| | 1997 | 0.3m² | 1.0m² | ... | 50,000 VEHICLES | 1,500kg | ... | III |
| | ⋮ | ⋮ | ⋮ | ⋮ | ⋮ | ⋮ | ⋮ | ⋮ |
| 102 | 2003 | 0.4m² | 0.5m² | ... | 20,000 VEHICLES | 600kg | ... | II |
| | ⋮ | ⋮ | ⋮ | ⋮ | ⋮ | ⋮ | ⋮ | ⋮ |
| | 2006 | 0.4m² | 0.5m² | ... | 15,000 VEHICLES | 1,300kg | ... | III |
| ⋮ | ⋮ | ⋮ | ⋮ | ⋮ | ⋮ | ⋮ | ⋮ | ⋮ |
| 200 | 2001 | 0m² | 0m² | ... | 20,000 VEHICLES | 0kg | ... | I |
| | ⋮ | ⋮ | ⋮ | ⋮ | ⋮ | ⋮ | ⋮ | ⋮ |

Fig.6

PREDICTION DATA

| STRUCTURE ID | YEAR | INSPECTION RECORD | | | SERVICE ENVIRONMENT INFORMATION | | | SOUNDNESS LEVEL |
|---|---|---|---|---|---|---|---|---|
| | | DAMAGE A | DAMAGE B | ... | AVERAGE DAILY TRAFFIC VOLUME | AMOUNT OF SNOW MELTING AGENT DISTRIBUTED | ... | |
| 201 | 2016 | 0.1m² | 0.2m² | ... | 30,000 VEHICLES | 700kg | ... | II |
| 202 | 2016 | 0.1m² | 0.2m² | ... | 20,000 VEHICLES | 1,400kg | ... | II |
| 203 | 2016 | 0.2m² | 0.5m² | ... | 10,000 VEHICLES | 2,100kg | ... | III |
| 204 | 2016 | 0.5m² | 0.3m² | ... | 15,000 VEHICLES | 1,300kg | ... | III |

Fig.7

| STRUCTURE ID | YEAR | SOUNDNESS LEVEL |
|---|---|---|
| 201 | 2017 | 2.1 |
| 202 | 2017 | 2.2 |
| 203 | 2017 | 3.4 |
| 204 | 2017 | 3.2 |

DEGRADATION PREDICTION APPARATUS, DEGRADATION PREDICTION METHOD, AND COMPUTER-READABLE RECORDING MEDIUM

This application is a National Stage Entry of PCT/JP2017/013718 filed on Mar. 31, 2017, the contents of all of which are incorporated herein by reference, in their entirety.

TECHNICAL FIELD

The present invention relates to a degradation prediction apparatus and a degradation prediction method for predicting degradation of an object such as an infrastructure structure, and further relates to a computer-readable recording medium where a program for realizing these is recorded.

BACKGROUND ART

For maintenance of infrastructure structures such as bridges, tunnels, road pavements, or the like, inspections are regularly conducted by inspectors through visual inspection, hammering, or the like. Degradation of a structure is determined manually based on the knowledge of the inspector according to the state of damage of the structure confirmed as a result of those inspections. Non-Patent Document 1 discloses a process for performing the inspections that accompany such a structure degradation determination, and for maintaining structures. This sort of degradation determination is also called a soundness determination.

Incidentally, it is difficult to repair all the damage existing in a large number of structures at the same time due to cost and restriction of human resources, so an administrator of the structures establishes a repair plan for the structures based on the results of degradation determinations obtained from inspections, and based on a predicted progression of degradation. Therefore, it is very important to perform degradation determinations and predict the progression of degradation every year.

Therefore, Patent Documents 1 and 2 propose a method of predicting degradation of a structure by constructing a physical model in advance, and establishing a repair plan based on the physical model. Also, Non-Patent Document 2 discloses a method of predicting degradation of a structure from an estimate of Markov transition probability. Furthermore, Non-Patent Document 3 discloses a method of evaluating degradation of a structure by executing multiple regression analysis on data acquired from periodically performed inspections, such as inspections of bridges on expressways.

LIST OF RELATED ART DOCUMENTS

Patent Documents

Patent Document 1: Japanese Patent Laid-Open Publication No. 2006-177080
Patent Document 2: Japanese Patent Laid-Open Publication No. 2006-323741

Non-Patent Documents

Non-Patent Document 1: East Japan Expressway Co., Ltd., Chuo Nippon Expressway Co., Ltd., West Japan Expressway Co., Ltd., "Maintenance Inspection Procedures, Structure Edition, April, 2015", NEXCO Research Institute, 2015.

Non-Patent Document 2: Kiyoyuki Kaito, Kiyoshi Kobayashi, "Bayesian Estimate of Markov Degradation Hazard Model", Proceedings of the Japan Society of Civil Engineers A, Vol. 63, No. 2, 2007.
Non-Patent Document 3: Yu Otake, Takashi Sasuga, Yusuke Honjo, Shigeyuki Murakami, Koichi Kobayashi, "Basic Research On Bridge Soundness Evaluation Based On a Bridge Inspection Database Using Statistical Techniques", Journal of the Japan Society of Civil Engineers A2, Vol. 67, No. 2, 2011.

SUMMARY OF INVENTION

Problems to be Solved by the Invention

However, with the methods disclosed in above Patent Documents 1 and 2, the physical model is constructed based on simple factors, so for a structure in which degradation progresses due to complex factors, it is not possible to predict degradation in each year in a detailed manner.

Also, according to the method disclosed in above Non-Patent Document 2, although it is possible to predict degradation every year with consideration of complex factors, the complex factors that can be considered are determined in advance, so it is not possible to perform prediction with consideration of new factors using many parameters.

Furthermore, according to the method disclosed in above Non-Patent Document 3, it is only possible to learn a model that predicts degradation in units of a set period, so it is not possible perform prediction with a finer granularity in time than the set period.

For example, the legal inspection cycle for expressway bridges is prescribed as five years. Therefore, the method disclosed in above Non-Patent Document 3 can only predict degradation every five years, and in a case where the administrator wishes to predict the soundness of a bridge that is the prediction object after one year, it is necessary to perform the prediction based on the administrator's own experience, taking into consideration the predicted soundness of the bridge after five years, past inspection results, and service environment information. The service environment information means the material, the physical structure, the amount of traffic, and the like of the structure that cause degradation of the structure.

An example object of the invention is to provide a degradation prediction apparatus, a degradation prediction method, and a computer-readable recording medium that address the above-described problems, such that it is possible, without manual intervention, to predict the state of degradation of an object such as a structure at an interval shorter than an interval of periodic diagnosis that is currently implemented.

Means for Solving the Problems

In order to achieve the example object described above, a degradation prediction apparatus according to an example aspect of the invention includes:
a data generation unit configured, using a degradation progression model for simulating the progression of degradation of an object, to generate data that would be obtained if periodic diagnosis were performed at an interval shorter than an interval at which periodic diagnosis of the object is currently implemented;
a prediction model generation unit configured, using the generated data, to generate a prediction model for predicting a degradation index indicating a degradation state of the object at a specific point in time; and a degradation index prediction unit configured to predict a future degradation index of the object based on the prediction model.

Also, in order to achieve the example object described above, a degradation prediction method according to an example aspect of the invention includes:

(a) a step of, using a degradation progression model for simulating the progression of degradation of an object, generating data that would be obtained if periodic diagnosis were performed at an interval shorter than an interval at which periodic diagnosis of the object is currently implemented;

(b) a step of, using the generated data, generating a prediction model for predicting a degradation index indicating a degradation state of the object at a specific point in time; and (c) a step of predicting a future degradation index of the object based on the prediction model.

Furthermore, in order to achieve the example object described above, a non-transitory computer-readable recording medium according to an example aspect of the invention includes a program recorded thereon, the program including instructions that cause a computer to carry out:

(a) a step of, using a degradation progression model for simulating the progression of degradation of an object, generating data that would be obtained if periodic diagnosis were performed at an interval shorter than an interval at which periodic diagnosis of the object is currently implemented;

(b) a step of, using the generated data, generating a prediction model for predicting a degradation index indicating a degradation state of the object at a specific point in time; and (c) a step of predicting a future degradation index of the object based on the prediction model.

Advantageous Effects of the Invention

As described above, according to the invention, it is possible, without manual intervention, to predict the state of degradation of an object such as a structure at an interval shorter than an interval of periodic diagnosis that is currently implemented.

BRIEF DESCRIPTION OF THE DRAWINGS

FIG. 3 shows an example of learning data used in an example embodiment of the invention.

FIG. 4 shows an example of generated data used in an example embodiment of the invention.

FIG. 5 shows the generated data shown in FIG. 4 and newly generated data.

FIG. 6 shows an example of prediction data used in an example embodiment of the invention.

FIG. 7 shows an example of predicted soundness levels predicted in an example embodiment of the invention.

EXAMPLE EMBODIMENT (Example Embodiment)

Following is a description of a degradation prediction apparatus, a degradation prediction method, and a program according to an example embodiment of the invention, with reference to FIGS. 1 to 10.

[Apparatus Configuration]

Figure 1:
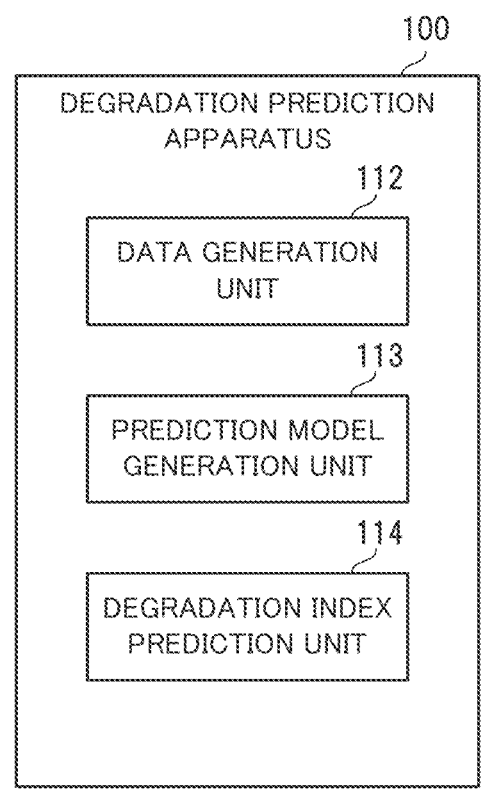
FIG. 1 is a block diagram showing a schematic configuration of a degradation prediction apparatus according to an example embodiment of the invention.

First, the configuration of a degradation prediction apparatus according to this example embodiment will be described with reference to FIG. 1. FIG. 1 is a block diagram showing the schematic configuration of the degradation prediction apparatus according to this example embodiment of the invention.

A degradation prediction apparatus 100 in this example embodiment, shown in FIG. 1, is a apparatus for predicting degradation of an object. As shown in FIG. 1, the degradation prediction apparatus 100 is provided with a data generation unit 112, a prediction model generation unit 113, and a degradation index prediction unit 114.

The data generation unit 112, using a degradation progression model for simulating the progression of degradation of the object, generates data that would be obtained if periodic diagnosis were performed at an interval shorter than an interval at which periodic diagnosis of the object is currently implemented.

The prediction model generation unit 113, using the generated data, generates a prediction model for predicting a degradation index indicating a degradation state of the object at a specific point in time. The degradation index prediction unit 114 predicts a future degradation index of the object based on the prediction model.

As described above, in this example embodiment, using the degradation progression model, a case is estimated where periodic diagnosis is performed at an interval shorter than an interval at which periodic diagnosis has been performed on the object, and data is newly generated. Then, a model for predicting a degradation index is generated from the data obtained in the original diagnosis and the data that was newly generated. Therefore, according to this example embodiment, it is possible, without manual intervention, to predict the state of degradation of an object such as a structure at an interval shorter than an interval of periodic diagnosis that is currently implemented.

Figure 2:
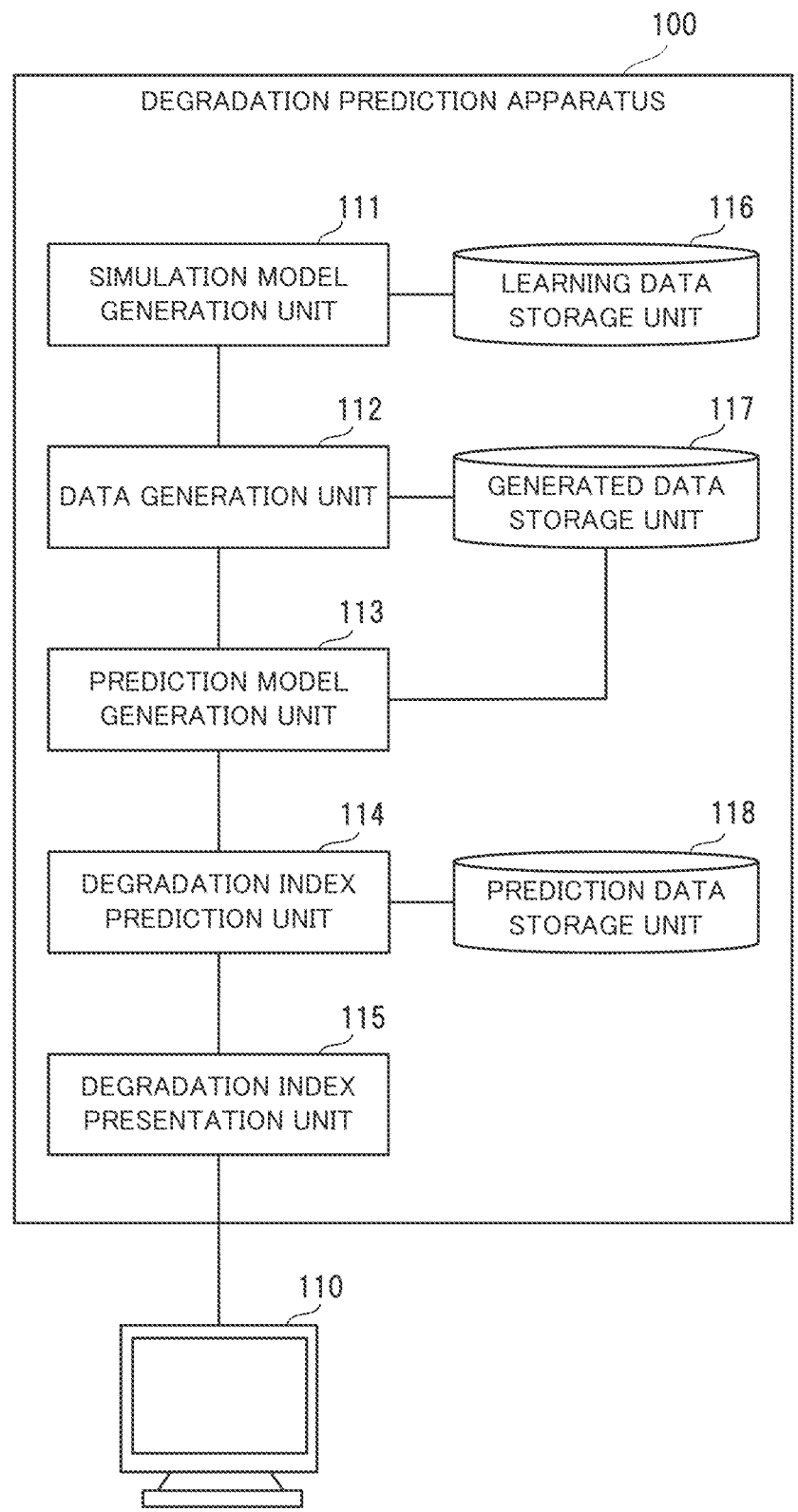
FIG. 2 is a block diagram showing a specific configuration of the degradation prediction apparatus according to an example embodiment of the invention.

Next, the configuration of the degradation prediction apparatus according to this example embodiment will be more specifically described with reference to FIG. 2. FIG. 2 is a block diagram showing the specific configuration of the degradation prediction apparatus according to this example embodiment of the invention. In FIGS. 1 and 2, the same reference signs are assigned to the same elements.

First, in this example embodiment, examples of the object include infrastructure structures (hereinafter, also simply referred to as "structures") such as bridges and tunnels. Also, the degradation progression model used by the data generation unit 112 is statistically created based on results of periodic diagnosis of the object, degradation factor information specifying a factor that causes degradation of the object, and a degradation index assigned based on the results of periodic diagnosis. Also, a record of inspections periodically performed on the infrastructure structure may be used as the results of periodic diagnosis. Also, service environment information specifying an environment in which the infrastructure structure is serving may be used as the degradation factor information.

Also, as shown in FIG. 2, in this example embodiment, in addition to the configuration shown in FIG. 1, the degradation prediction apparatus 100 also includes a simulation model generation unit 111, a degradation index presentation unit 115, a learning data storage unit 116, a generated data storage unit 117, and a prediction data storage unit 118.

The learning data storage unit 116 stores learning data used to generate the degradation progression model. The learning data indicates service environment information of each of one or more structures serving as a learning object, an inspection record of each structure, and results of a degradation determination (a degradation index) performed for the inspection record of the corresponding structure. The inspection record is data generated according to inspections performed in periodic diagnosis of the structure. Also, results of the degradation determination in the learning data, that is, the degradation index, are assigned based on the results of the inspection record, for example, by a skilled expert or a group of experts at the time of the periodic diagnosis. The learning data is stored in the learning data storage unit 116 by a user or the like in advance. The service environment information is information indicating the environment in which the structure served in the year in which the periodic diagnosis was performed.

FIG. 3 shows an example of the learning data used in this example embodiment of the invention. In the example shown in FIG. 3, the learning data includes service environment information, an inspection record, and a soundness level, associated with an identifier of the structure serving as the learning object (a structure ID (identifier)) and each inspection year. Also, in FIG. 3, the "soundness level" represents the degradation index, which is a result of the degradation determination described above.

Also, the area $[m^2]$ of each item of damage ("damage A", "damage B", and so forth) existing in the structure is registered in the inspection record column. Here, each item of damage may be, for example, a different type of damage such as water leakage or rebar exposure, or may be damage of a different portion of the structure.

In the service environment information column, a number of annual traveling vehicles that travel on the corresponding structure in the corresponding year, an annual accumulated axial load, an amount of snow melting agent sprayed to prevent freezing, a service start year of the corresponding structure, a physical structure of the corresponding structure, or the like are registered for the corresponding year.

In this example embodiment, in the soundness level column, a soundness level is registered whose value decreases as the object structure is more sound (as the degree of degradation is smaller). The soundness level indicates the degradation index as described above. For example, a structure that has a soundness level of "4" and a structure ID of "2" (hereinafter referred to as a structure "2") is more sound than a structure "1" that has a soundness level of "5" (see FIG. 3). Note that in FIG. 3, the soundness level is indicated by Roman numerals.

The simulation model generation unit 111 reads the learning data from the learning data storage unit 116, and generates a degradation progression model (a simulation model) using the learning data that was read.

The simulation model generation unit 111 uses a Markov degradation hazard model as a simulation model in which, for example, each item of service environment information in the learning data and each item of the inspection record are used as covariates, and from this Markov degradation hazard model, a mathematical equation is generated that represents the relationship between a soundness level transition probability, the number of years that have passed, each item of service environment information, and each item of the inspection record.

The simulation model generation unit 111 may generate a simulation model by a method other than the Markov degradation hazard model, as long as it is possible to represent the relationship between the soundness level transition probability, the number of years that have passed, each item of service environment information, and each item of the inspection record. For example, the simulation model generation unit 111 may generate a simulation model by survival time analysis based on a Weibull hazard function.

The generated data storage unit 117 stores generated data for the prediction model generation unit 113 to generate a prediction model. The generated data includes the soundness level and the results of periodic diagnosis performed at set intervals for the object. Also, the periodic diagnosis results include an inspection record obtained by inspection performed at set intervals for the object structure. Also, the generated data includes service environment information of years in which inspection was performed and service environment information of years other than years in which inspection was performed.

FIG. 4 shows an example of the generated data used in this example embodiment of the invention. In the example shown in FIG. 4, the generated data is configured with the service environment information, the inspection record, and the soundness level assigned to the inspection record, associated with the structure ID of the structure serving as the learning object and each inspection year. The generated data is stored in the generated data storage unit 117 by a user or the like in advance. Also, in the example shown in FIG. 4, service environment information of years in which inspection was not performed is also stored as generated data.

Also, in FIG. 4, the data generation unit 112 newly generates an inspection record and a soundness level for years in which inspection was not performed. FIG. 5 shows the generated data shown in FIG. 4 and newly generated data. As shown in FIG. 5, when data is generated by the data generation unit 112, the generated data storage unit 117 stores generated data and the data generated by the data generation unit 112.

In this example embodiment, the data generation unit 112, using the simulation generated by the simulation model generation unit 111, generates a soundness level and an inspection record for years in which inspection was not performed, as data that would be obtained if periodic diagnosis were performed at an interval shorter than the interval at which periodic diagnosis of the object is currently implemented. Specifically, using the simulation model generated by the simulation model generation unit 111, the soundness level in years in which inspection was not performed is probabilistically calculated based on the inspection record and the service environment information. Also, the data generation unit 112 uses the simulation model to estimate the inspection record in years in which inspection was not performed based on the inspection record in years in which inspection was performed.

Specifically, for example, the data generation unit 112 inputs the service environment information, the inspection record, the soundness level, and a designated number of past years for a structure included in the generated data into the simulation model. Then, the data generation unit 112 calculates the soundness level according to the soundness level transition probability obtained by this information. Note that, hereinafter, the soundness level calculated by the data generation unit 112 will be referred to as the "generated soundness level", and will be distinguished from other soundness levels.

For example, as a simulation model, the simulation model generation unit 111 generates "size of damage is 1 m$^2$ in the inspection record of the structure; service environment information: average daily traffic volume of large vehicles is 50,000 vehicles; assuming current soundness level 2, 80% probability that soundness level becomes 3 after one year." In this case, for a structure that has a size of damage of 1 m$^2$ or more and a soundness level of 2 in the learning data, there is an 80% probability that the soundness level becomes 3 after one year, so the data generation unit 112 calculates the soundness level as "3".

Also, the data generation unit 112 generates an inspection record for years in which inspection was not performed for the object structure by referring to the inspection results of years in which inspection was performed. For example, the data generation unit 112 refers to the inspection record obtained by the inspection performed latest prior to each year in which inspection was not performed, and supplements the inspection record of the years in which inspection was not performed. Also, the data generation unit 112 may use a physical degradation model formula corresponding to each respective item of the inspection record, and adapt the inspection record of years in which inspection was performed to supplement the inspection record of the years in which inspection was not performed. Furthermore, in order to generate an inspection record of a year in which inspection was not performed, the data generation unit 112 may refer to the inspection record of years in which inspection was performed before and after the relevant year, and proportionally divide by the difference in the number of years between the relevant year and the respective years in which inspection was performed.

In this example embodiment, the prediction model generation unit 113, from the generated data storage unit 117, reads the generated data stored in advance in the generated data storage unit 117 and the newly generated data and uses the read data (see FIG. 4) to generate a prediction model.

Specifically, the prediction model generation unit 113 first executes multiple regression analysis, for example, using each item of the past service environment information, each item of the inspection record, and the soundness level in the generated data (including the newly generated data) as explanatory variables, and using the latest soundness level as an objective variable. Then, from the result of the multiple regression analysis, the prediction model generation unit 113 generates a mathematical equation that represents the relationship between the latest soundness level, a past soundness level, each item of service environment information, and each item of the inspection record, and uses the obtained equation as the prediction model.

For example, when generating a prediction model that predicts the soundness level after one year, the prediction model generation unit 113 uses the latest soundness level, the soundness level from one year earlier, each item of service environment information, and each item of the inspection record as explanatory variables.

Also, the prediction model generation unit 113 can generate a prediction model by a method other than multiple regression analysis, as long as it is possible to represent the relationship between the latest soundness level, a past soundness level, each item of service environment information, and each item of the inspection record. For example, the prediction model generation unit 113 can generate a prediction model by weighting each value included in the data generated by the data generation unit 112 according to the probability (soundness transition probability) obtained by the degradation progression model.

Also, the prediction model generation unit 113 may generate a prediction model using Support Vector Regression or Deep Learning. Also, the prediction model generation unit 113 may generate a prediction model using a C4.5 algorithm that represents the relationship between explanatory variables and target variables in the form of if-then rules.

The prediction data storage unit 118 stores data (hereinafter referred to as "prediction data") that the degradation index prediction unit 114 uses for prediction. The prediction data is, for example, data that includes service environment information for each year before the year to be predicted, the inspection record for each of those years, and the soundness level determined for the corresponding inspection record, with respect to one or more structures serving as objects.

FIG. 6 shows an example of the prediction data used in this example embodiment of the invention. In the example shown in FIG. 6, the prediction data is configured with the service environment information of the latest year, the latest inspection record, and the latest soundness level associated with each structure ID serving as an inspection object. Note that here, the service environment information and the inspection record include the same items as the service environment information and the inspection record in the learning data. The prediction data also is stored in the prediction data storage unit 118 by a user or the like in advance.

In this example embodiment, the degradation index prediction unit 114, using the prediction model generated by the prediction model generation unit 113, predicts the soundness levels of structures serving as prediction objects included in the prediction data read from the prediction data storage unit 118. Note that, hereinafter, the soundness level (degradation index) predicted by the degradation index prediction unit 114 is also referred to as the "predicted soundness level".

The degradation index prediction unit 114 predicts the soundness level, for example, by applying the latest service environment information, the latest inspection record, and the latest soundness level of structures included in the prediction data to the prediction model. Specifically, as a prediction model, it is assumed that a rule is defined that "size of damage is 1 m$^2$ or more in the inspection record of the structure; service environment information: average daily traffic volume of large vehicles is 50,000 vehicles; assuming current soundness level 2, soundness level predicted to be 3."

In this case, from the prediction data, when it is possible to specify a structure for which "size of damage is 1 m$^2$ or more, average daily traffic volume of large vehicles is 50,000 vehicles, and current soundness level is 2", the predicted soundness level of this structure is predicted to be 3 by the degradation index prediction unit 114. Note that even if the soundness level is represented by an integer in the generated data used to generate the prediction model, the predicted soundness level is not limited to an integer.

FIG. 7 shows an example of predicted soundness levels predicted in this example embodiment of the invention. As shown in FIG. 7, the degradation index prediction unit 114 predicts the future soundness of each structure. Note that the degradation index prediction unit 114 can also predict the predicted soundness level of prediction data input from a user or the like through an external device, instead of predicting the soundness level of the prediction data stored in the prediction data storage unit 118.

The degradation index presentation unit 115 presents the soundness level predicted by the degradation index prediction unit 114 on a screen of a display device 110 connected to the degradation prediction apparatus 100. As a result, the predicted soundness level is presented to the user or the like. Also, instead of the display device 110, the degradation index prediction unit 114 can transmit a list (see FIG. 7) of structure IDs of prediction objects to a terminal device connected to the degradation prediction apparatus 100 through a network, and present the predicted soundness levels on a screen of the terminal device.

[Operation]

Figure 8:
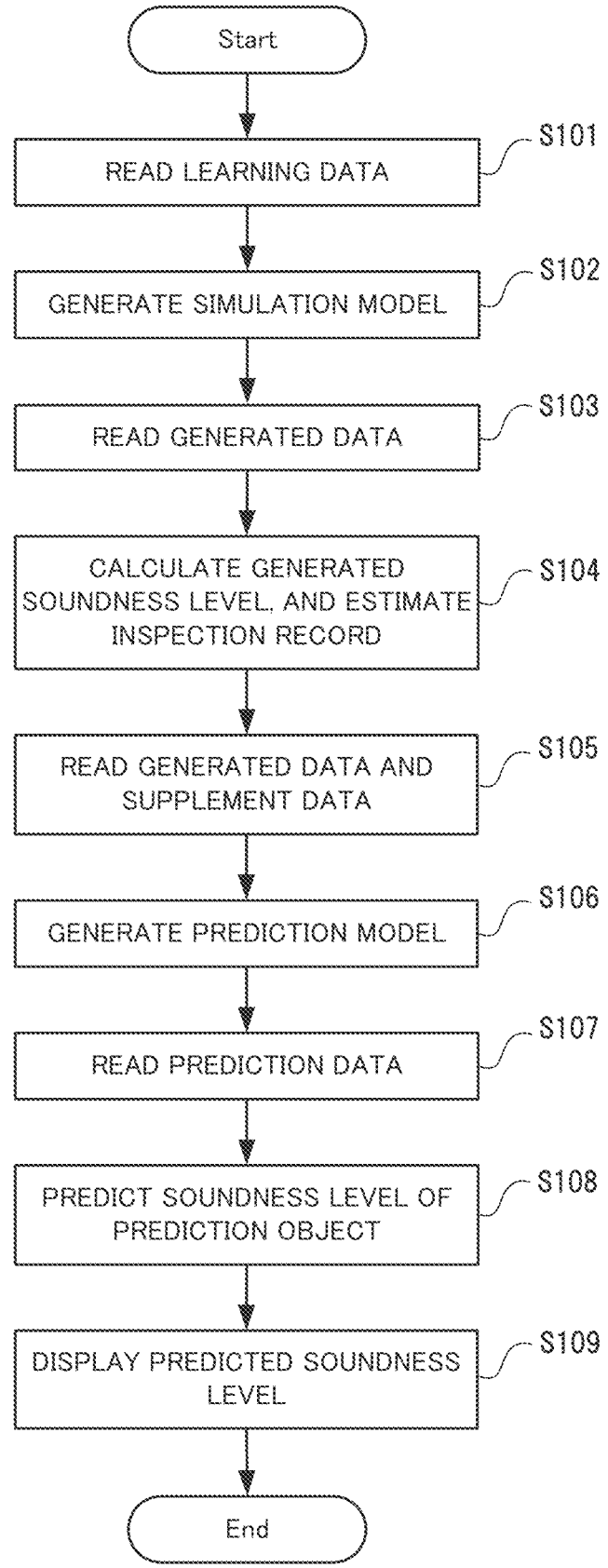
FIG. 8 is a flowchart showing operation of the degradation prediction apparatus according to an example embodiment of the invention.

Next, operation of the degradation prediction apparatus 100 according to this example embodiment will be described with reference to FIG. 8. FIG. 8 is a flowchart showing operation of the degradation prediction apparatus according to this example embodiment of the invention. The following description refers to FIGS. 1 to 7 as appropriate. Also, in this example embodiment, a degradation prediction method is implemented by operating the degradation prediction apparatus 100. Thus, the description of the degradation prediction method in this example embodiment can be replaced with the description of operation of the degradation prediction apparatus 100 below.

As shown in FIG. 8, first, the simulation model generation unit 111 reads learning data from the learning data storage unit 116 (step S101). Next, the simulation model generation unit 111 generates a degradation progression model (simulation model) using the learning data that was read (step S102).

Next, the data generation unit 112 reads the generated data from the generated data storage unit 117 (step S103). Then, the data generation unit 112 uses the simulation model to calculate the soundness level of years in which inspection of the object structures included in the generated data was not performed, and at the same time, estimates the inspection record of years in which inspection was not performed (step S104). Also, the data generation unit 112 stores the calculated soundness level and the estimated inspection record in the generated data storage unit 117.

Next, the prediction model generation unit 113 reads, from the generated data storage unit 117, the generated data stored in advance and the newly generated data (including the generated soundness levels) (step S105). Then, the prediction model generation unit 113 generates a prediction model using the data that was read (step S106).

Next, the degradation index prediction unit 114 reads prediction data from the prediction data storage unit 118 (step S107). Then, the degradation index prediction unit 114 predicts the predicted soundness levels of the prediction object structures included in the prediction data, using the prediction model (step S108).

Next, the degradation index presentation unit 115 presents the predicted soundness levels of the prediction object structures predicted in step S108 on the screen of the display device 110 (step S109).

[Specific Example]

Next, a specific example of operation of the degradation prediction apparatus 100 according to this example embodiment will be described. Also, in the following description, it is assumed that the learning data shown in FIG. 3 is stored in the learning data storage unit 116, and the generated data shown in FIG. 4 is stored in the generated data storage unit 117. Furthermore, it is assumed that the prediction data shown in FIG. 6 is stored in the prediction data storage unit 118, the prediction objects are each of the structures with the structure IDs 201 to 204 included in that prediction data, and prediction of soundness levels for the year 2017 is performed.

First, the simulation model generation unit 111 acquires an inspection record, service environment information, and a soundness level for every five years between 1991 and 2016, with respect to each of the structures with the structure IDs 1 to 100 included in the learning data shown in FIG. 3. Next, the simulation model generation unit 111 uses the acquired data to execute estimation using a Markov degradation hazard model (see Non-Patent Document 2), which is a simulation model.

Specifically, the simulation model generation unit 111, using each item of the service environment information and the inspection record as covariates, generates a simulation model such that when the current soundness level is represented by i, the probability of a transition to a soundness level after t years is expressed by the following Equation 1.

$$p\,(\text{soundness level after } t \text{ years} = j\,|\,\text{current soundness level} = i) = \sum_{a=i}^{j} \prod_{b=i}^{\alpha} \frac{\sum_{p=1}^{P} w_{b,p} x_p}{\sum_{p=0}^{P} (w_{b,p} - w_{a,p}) x_p} \prod_{b=i+1}^{j-1} \frac{\sum_{p=1}^{P} w_{b,p} x_p}{\sum_{p=0}^{P} (w_{b+1,p} - w_{a,p}) x_p} \exp\left(t \sum_{p=0}^{P} w_{a,p} x_p\right)$$

[Equation 1]

In the above Equation (1), p (soundness level after t years=j|current soundness level=i) indicates the probability of transitioning from the soundness level i to the soundness level j after t years. Each item of the inspection record and each item of service environment information are represented by $x_p$ (p=1, 2, 3, . . . , P). Coefficients $w_{a,\,p}$ (a=1, 2, . . . , j) are coefficients for each item of the inspection record and each item of service environment information estimated from the data. However, $x_0$ is 1, and $w_{a,\,0}$ is a constant term.

Next, the data generation unit 112 reads the generated data shown in FIG. 4 from the generated data storage unit 117. Then, as shown in FIG. 5, the data generation unit 112 calculates a probabilistically generated soundness level based on the soundness transition probability of the simulation model for years in which inspection was not performed, with respect to each of the structures with the structure IDs 101 to 200 included in the generated data that was read. Also, the data generation unit 112 estimates the inspection record of years in which inspection was not performed, by referring to the inspection record obtained by the inspection performed latest prior to each year in which inspection was not performed.

For example, the data generation unit 112 estimates each item of the 2013 inspection record by referring to the 2011 inspection record. Also, the data generation unit 112 may perform estimation using a physical degradation model formula corresponding to each respective item of the inspection record. Furthermore, the data generation unit 112 may supplement the data by referring to the inspection record of years in which inspection was performed before and after the relevant year, and proportionally dividing by the difference in the number of years between the relevant year and the respective years in which inspection was performed.

Next, the prediction model generation unit 113 reads the generated data shown in FIG. 5 and the newly generated data, and executes a linear regression analysis by a least squares method, using the inspection record, the service environment information, and the soundness level of all years, with respect to each of the structures with the structure IDs 101 to 200 included in the data that was read.

Specifically, the prediction model generation unit 113, using the inspection results of each year, each item of service environment information, and the soundness level of the corresponding year as explanatory variables, and using the soundness level of one year after the corresponding year as an objective variable, constructs a prediction model where each year of each structure is one sample of generated data. The prediction model, for example, is expressed by the following Equation 2.

$$y\_(t+1) = B\_t \times Y\_t + x\_1 \times A\_1 + x\_2 \times A\_2 + \ldots + x\_P \times A\_P + A\_0 \quad \text{[Equation 2]}$$

In the above Equation 2, y_(t+1) represents the soundness level after one year, and x_1 to x_P respectively represent the inspection record and each item of service environment information for the corresponding year. Also, y_t represents the soundness level of the corresponding year, and B_t and A_1 to A_P respectively represent regression coefficients, and A_0 represents a constant term.

Also, when the prediction model generation unit 113 executes an ordinary linear regression analysis by a least squares method, alternatively, the prediction model generation unit 113 may execute the linear regression analysis by a weighted least squares method using the soundness transition probability of the simulation model as the weight. For example, in the supplement data created by the data generation unit 112, it is assumed that the soundness level in the year 1992 for the structure with a structure ID of 101 is II, with a transition probability of 50%. In this case, the prediction model generation unit 113 performs the linear regression analysis by the weighted least squares method using a weight of 0.5 for that sample.

As shown in FIG. 7, the degradation index prediction unit 114, using the prediction model calculated in this way, calculates a predicted soundness level for each of the structures with structure IDs of 201 to 204 included in the prediction data shown in FIG. 6.

Figure 9:
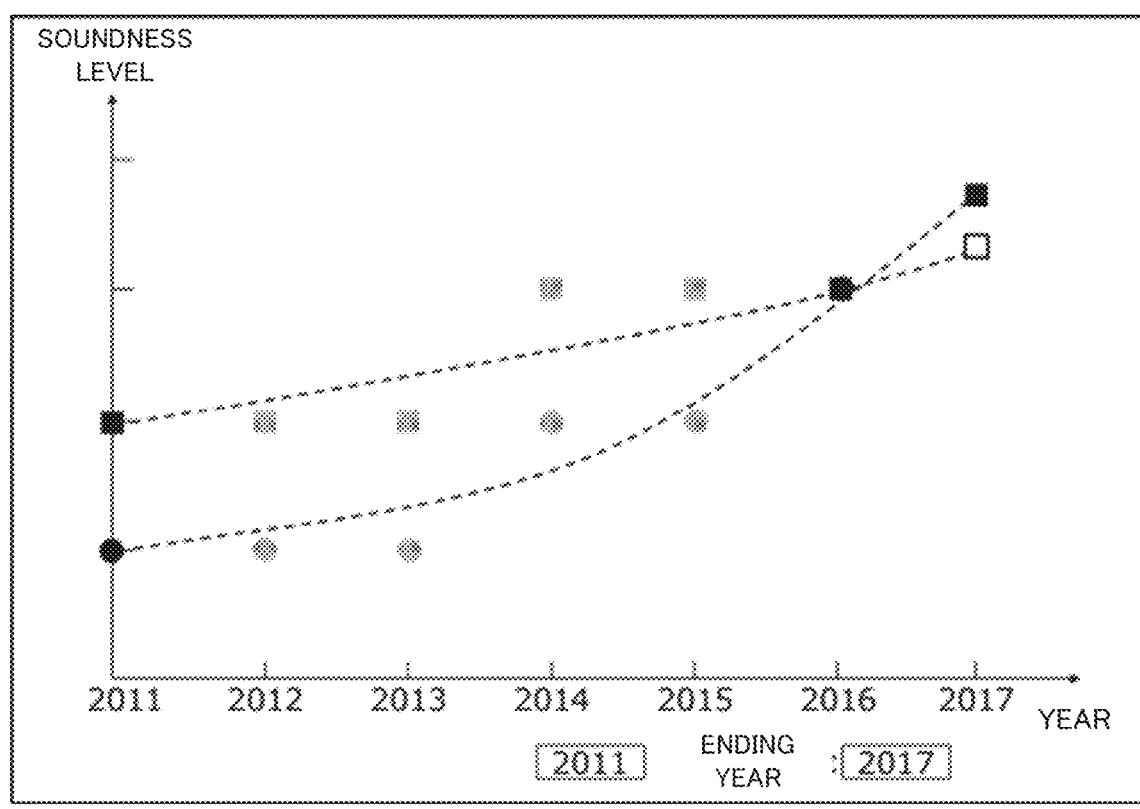
FIG. 9 shows an example of an output screen of prediction results according to an example embodiment of the invention.

Also, the degradation index presenting unit 115 causes the screen shown in FIG. 9 to be displayed on the screen of the display device 110. FIG. 9 shows an example of an output screen of prediction results according to this example embodiment of the invention. In the example shown in FIG. 9, in the output screen, the degradation index presentation unit 115 refers to the simulation model used by the data generation unit 112 and supplements the soundness level of a past year in which inspection was not performed, and therefore a graph is displayed showing the transition of the soundness level in an arbitrary period spanning from past inspection to the future.

The user or the like can efficiently decide a structure to be repaired preferentially by referring to the output screen of FIG. 9. In the example shown in FIG. 9, the transition of the soundness level for two structures (bridges) is displayed in the graph. In FIG. 9, gray circles indicate the soundness levels generated by the simulation model of one bridge. Gray squares indicate the soundness levels generated by the simulation model of the other bridge.

Also, black squares (■) and black circles (●) in the years 2011 and 2016 indicate the soundness levels of the two bridges obtained in actual periodic diagnosis. Furthermore, the black square (■) and the open square (□) in the year 2017 respectively indicate the predicted soundness levels of the two bridges. Also, two broken lines in FIG. 9 respectively indicate the transition of the soundness level of the two bridges calculated by spline interpolation or the like from the soundness level of each bridge in each year.

Note that the screen presented by the degradation index presentation unit 115 is not limited to the output screen shown in FIG. 9, and any screen that allows a user or the like to identify predicted soundness levels may be used. For example, as shown in FIG. 7, a screen showing a list in which the predicted soundness level is indicated for each prediction object structure may be used.

[Advantageous Effects of Example Embodiment]

According to this example embodiment, it is possible to automatically predict a soundness level when an arbitrary number of years has passed without relying on a person. The reason for this is that the data generation unit 112 generates a soundness level of each year for a learning object structure based on a simulation model, the prediction model generation unit 113 generates a prediction model of the soundness level when an arbitrary number of years have passed, and the degradation index prediction unit 114 calculates a predicted soundness level of a prediction object structure based on the prediction model. As a result, a user or the like can obtain results of predicting the soundness level of an arbitrary year without performing manual processing.

[Program]

A program according to this example embodiment may be a program that causes a computer to execute steps S101 to S109 shown in FIG. 8. By installing this program in the computer and executing the program, the degradation prediction apparatus 100 and the degradation prediction method according to this example embodiment can be realized. In this case, a CPU (Central Processing Unit) of the computer performs processing to function as the simulation model generation unit 111, the data generation unit 112, the prediction model generation unit 113, the degradation index prediction unit 114, and the degradation index presentation unit 115.

Also, in this example embodiment, the learning data storage unit 116, the generated data storage unit 117, and the prediction data storage unit 118 can be realized by storing a data file forming these units in a storage device such as a hard disk provided in the computer, or these units can be realized by mounting a recording medium where the data file is stored in a reading device connected to the computer.

Also, the program according to this example embodiment may be executed by a computer system constructed using a plurality of computers. In this case, for example, each computer may respectively function as any of the simulation model generation unit 111, the data generation unit 112, the prediction model generation unit 113, the degradation index prediction unit 114, and the degradation index presentation unit 115. Also, the learning data storage unit 116, the generated data storage unit 117, and the prediction data storage unit 118 may be constructed on a computer other than the computer that executes the program according to this example embodiment.

[Physical Configuration]

Figure 10:
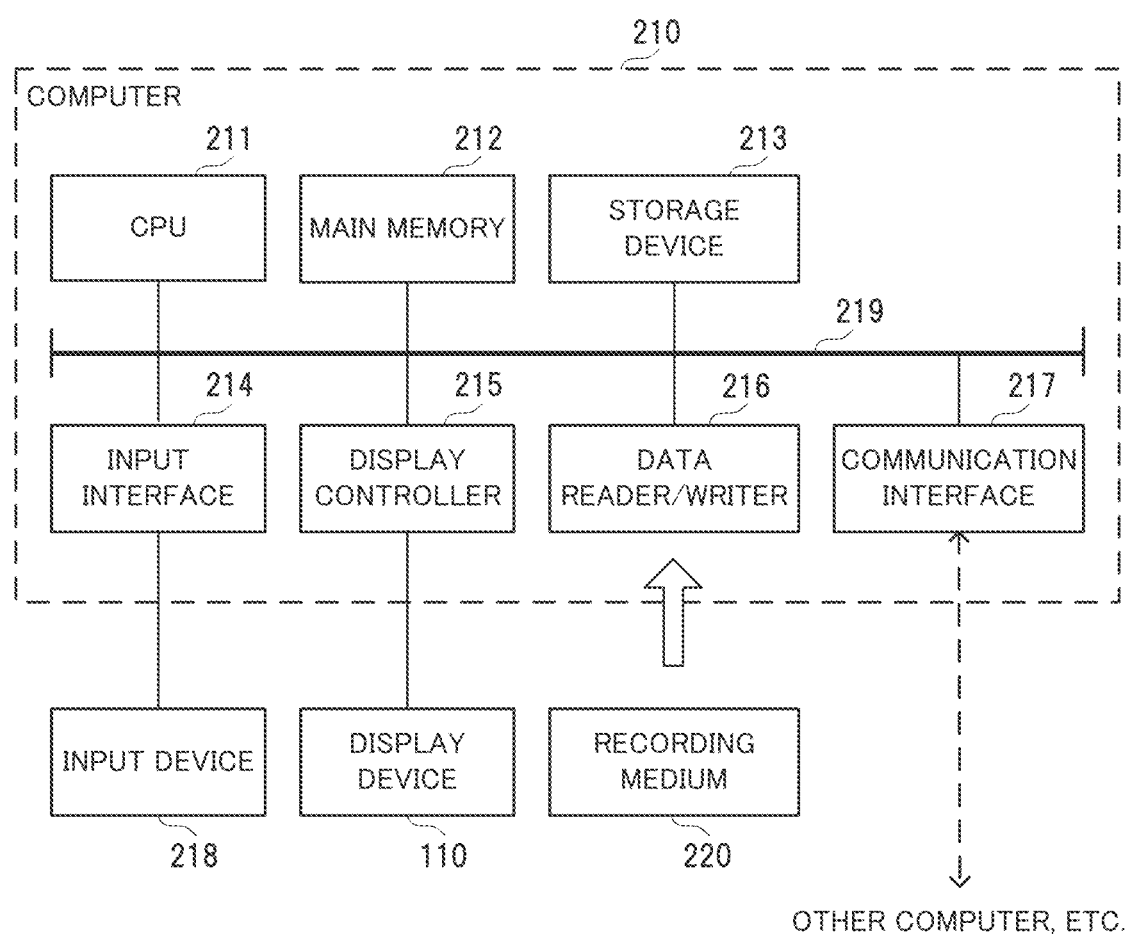
FIG. 10 is a block diagram showing an example of a computer that realizes the degradation prediction apparatus according to an example embodiment of the invention.

Here, a computer that realizes the degradation prediction apparatus 100 by executing the program according to this example embodiment will be described with reference to FIG. 10. FIG. 10 is a block diagram showing an example of a computer that realizes the degradation prediction apparatus according to an example embodiment of the invention.

As shown in FIG. 10, the computer 210 includes a CPU (Central Processing Unit) 211, a main memory 212, a storage device 213, an input interface 214, a display controller 215, a data reader/writer 216, and a communications interface 217. These units are each connected so as to be capable of performing data communications with each other through a bus 219.

The CPU 211 opens the program (code) according to this example embodiment, which has been stored in the storage device 213, in the main memory 212 and performs various operations by executing the program in a predetermined order. The main memory 212 is typically a volatile storage device such as a DRAM (Dynamic Random Access Memory). Also, the program according to this example embodiment is provided in a state stored in a computer-readable recording medium 220. Note that the program according to this example embodiment may be distributed on the Internet, which is connected through the communications interface 217.

Also, other than a hard disk drive, a semiconductor storage device such as a flash memory can be given as a specific example of the storage device 213. The input interface 214 mediates data transmission between the CPU 211 and an input device 218, which may be a keyboard or mouse. The display controller 215 is connected to a display device 110, and controls display on the display device 110.

The data reader/writer 216 mediates data transmission between the CPU 211 and the recording medium 220, and executes reading of a program from the recording medium 220 and writing of processing results in the computer 210 to the recording medium 220. The communications interface 217 mediates data transmission between the CPU 211 and other computers.

Also, general-purpose semiconductor storage devices such as CF (Compact Flash (registered trademark)) and SD (Secure Digital), a magnetic recording medium such as a Flexible Disk, or an optical recording medium such as a CD-ROM (Compact Disk Read-Only Memory) can be given as specific examples of the recording medium 220.

Also, instead of a computer in which a program is installed, the degradation prediction apparatus 100 according to this example embodiment can also be realized by using hardware corresponding to each unit, for example, by using circuitry. Furthermore, a portion of the degradation prediction apparatus 100 may be realized by a program, and the remaining portion realized by hardware. Here, the term circuitry conceptually includes a single device, a plurality of devices, a chipset, or a cloud.

Some portion or all of the example embodiments described above can be realized according to (supplementary note 1) to (supplementary note 12) described below, but the below description does not limit the invention.

(Supplementary Note 1)

A degradation prediction apparatus, including:

a data generation unit configured, using a degradation progression model for simulating the progression of degradation of an object, to generate data that would be obtained if periodic diagnosis were performed at an interval shorter than an interval at which periodic diagnosis of the object is currently implemented;

a prediction model generation unit configured, using the generated data, to generate a prediction model for predicting a degradation index indicating a degradation state of the object at a specific point in time; and a degradation index prediction unit configured to predict a future degradation index of the object based on the prediction model.

(Supplementary Note 2)

The degradation prediction apparatus according to supplementary note 1, wherein the degradation progression model is statistically created based on results of periodic diagnosis of the object, degradation factor information specifying a factor that causes degradation of the object, and the degradation index assigned based on the results of periodic diagnosis.

(Supplementary Note 3)

The degradation prediction apparatus according to supplementary note 2, wherein the object is an infrastructure structure, the degradation progression model is statistically created using a record of inspections periodically performed on the infrastructure structure as the results of periodic diagnosis, and also, using service environment information specifying an environment in which the infrastructure structure is serving, as the degradation factor information, and the degradation index prediction unit predicts the future degradation index of the object by applying the inspection record of the object, the service environment information, and the degradation index to the prediction model.

(Supplementary Note 4)

The degradation prediction apparatus according to supplementary note 3, wherein the prediction model generation unit generates the prediction model by weighting each value included in the data generated by the data generation unit according to a probability obtained by the degradation progression model.

(Supplementary Note 5)

A degradation prediction method, including:

(a) a step of, using a degradation progression model for simulating the progression of degradation of an object, generating data that would be obtained if periodic diagnosis were performed at an interval shorter than an interval at which periodic diagnosis of the object is currently implemented;

(b) a step of, using the generated data, generating a prediction model for predicting a degradation index indicating a degradation state of the object at a specific point in time; and (c) a step of predicting a future degradation index of the object based on the prediction model.

(Supplementary Note 6)

The degradation prediction method according to supplementary note 5, wherein the degradation progression model is statistically created based on results of periodic diagnosis of the object, degradation factor information specifying a factor that causes degradation of the object, and the degradation index assigned based on the results of periodic diagnosis.

(Supplementary Note 7)

The degradation prediction method according to supplementary note 6, wherein the object is an infrastructure structure, the degradation progression model is statistically created using a record of inspections periodically performed on the infrastructure structure as the results of periodic diagnosis, and also, using service environment information specifying an environment in which the infrastructure structure is serving, as the degradation factor information, and in the (c) step, the future degradation index of the object is predicted by applying the inspection record of the object, the service environment information, and the degradation index to the prediction model.

(Supplementary Note 8)

The degradation prediction method according to supplementary note 7, wherein in the (b) step, the prediction model is generated by weighting each value included in the data generated in the (a) step according to a probability obtained by the degradation progression model.

(Supplementary Note 9)

A computer-readable recording medium that includes a program recorded thereon, the program including instructions that cause a computer to carry out:

(a) a step of, using a degradation progression model for simulating the progression of degradation of an object, generating data that would be obtained if periodic diagnosis were performed at an interval shorter than an interval at which periodic diagnosis of the object is currently implemented;

(b) a step of, using the generated data, generating a prediction model for predicting a degradation index indicating a degradation state of the object at a specific point in time; and (c) a step of predicting a future degradation index of the object based on the prediction model.

(Supplementary Note 10)

The computer-readable recording medium according to supplementary note 9, wherein the degradation progression model is statistically created based on results of periodic diagnosis of the object, degradation factor information specifying a factor that causes degradation of the object, and the degradation index assigned based on the results of periodic diagnosis.

(Supplementary Note 11)

The computer-readable recording medium according to supplementary note 10, wherein the object is an infrastructure structure, the degradation progression model is statistically created using a record of inspections periodically performed on the infrastructure structure as the results of periodic diagnosis, and also, using service environment information specifying an environment in which the infrastructure structure is serving, as the degradation factor information, and in the (c) step, the future degradation index of the object is predicted by applying the inspection record of the object, the service environment information, and the degradation index to the prediction model.

(Supplementary Note 12)

The computer-readable recording medium according to supplementary note 11, wherein in the (b) step, the prediction model is generated by weighting each value included in the data generated in the (a) step according to a probability obtained by the degradation progression model.

Although the invention is described above with reference to example embodiments, the invention is not limited by the above example embodiments. Within the scope of the invention, various modifications understandable by those skilled in the art can be made to the configurations or details of the invention.

INDUSTRIAL APPLICABILITY

As described above, according to the invention, it is possible, without manual intervention, to predict the state of degradation of an object such as a structure at an interval shorter than an interval of periodic diagnosis that is currently implemented. The invention is useful in a system that estimates degradation and damage over time of a structure, or of an organism.

DESCRIPTION OF REFERENCE SIGNS

100 Degradation prediction apparatus
110 Display device
111 Simulation model generation unit
112 Data generation unit
113 Prediction model generation unit
114 Degradation index prediction unit
115 Degradation index presentation unit
116 Learning data storage unit
117 Generated data storage unit
118 Prediction data storage unit
210 Computer
211 CPU
212 Main memory
213 Storage device
214 Input interface
215 Display controller
216 Data reader/writer
217 Communications interface
218 Input device
219 Bus
220 Recording medium

What is claimed is:

1. A degradation prediction apparatus, comprising:

a simulation model generation unit configured to generate a degradation progression model based on a learning data, which includes an inspection interval information indicating period indicating an interval in which a structure was inspected, a first inspection record information indicating an inspection record of the structure, a service environment information indicating an environment in which the structure is provided, and a first soundness level information indicating the soundness of structure, associated with a structure identification (ID) to identify the structure of an object in the learning data;

a data generation unit configured to:
estimate a second inspection record information and a second soundness level information corresponding to an interval, in which, inspection was not performed, by inputting into the degradation progression model, the first inspection record information, the service environment information, the first soundness level information and information indicating a past interval included in a generated data that was previously generated, and
supplement the generated data with the second inspection record information and the second soundness level information;

a prediction model generation unit configured to generate a prediction model for predicting a degradation index indicating a degradation state of the object at a specific point in time based on the first inspection record information, the second inspection record information, the first soundness level information and the second soundness level information; and a degradation index prediction unit configured to predict a soundness level corresponding to a structure of an inspection object by inputting a prediction data including a latest inspection interval information, a latest inspection record information, a latest service environment information and a latest soundness level information, associated with a structure ID to identify the structure of the inspection object into the prediction model to predict a soundness level corresponding to the structure of the inspection object.

2. The degradation prediction apparatus according to claim 1,
wherein the degradation progression model is a Markov degradation hazard model that uses, as covariates, service state information that represents a service state of one or more structures included in the service environment information and damage state information that represents a damage state of the one or more structures included in the first inspection record information.

3. A degradation prediction method, comprising:
generating a degradation progression model based on a learning data, which includes an inspection interval information indicating period indicating an interval in which a structure was inspected, a first inspection record information indicating an inspection record of the structure, a service environment information indicating an environment in which the structure is provided, and a first soundness level information indicating the soundness of structure, associated with a structure identification (ID) to identify the structure of an object in the learning data;
estimating a second inspection record information and a second soundness level information corresponding to an interval, in which, inspection was not performed, by inputting into the degradation progression model, the first inspection record information, the service environment information, the first soundness level information and information indicating a past interval included in a generated data that was previously generated, and supplementing the generated data with the second inspection record information and the second soundness level information;
generating a prediction model for predicting a degradation index indicating a degradation state of the object at a specific point in time based on the first inspection record information, the second inspection record information, the first soundness level information and the second soundness level information; and
predicting a soundness level corresponding to a structure of an inspection object by inputting a prediction data including a latest inspection interval information, a latest inspection record information, a latest service environment information and a latest soundness level information, associated with a structure ID to identify the structure of the inspection object into the prediction model to predict a soundness level corresponding to the structure of the inspection object.

4. The degradation prediction method according to claim 3,
wherein the degradation progression model is a Markov degradation hazard model that uses, as covariates, service state information that represents a service state of one or more structures included in the service environment information and damage state information that represents a damage state of the one or more structures included in the first inspection record information.

5. A non-transitory computer-readable recording medium that includes a program recorded thereon, the program including instructions that cause a computer to carry out:
generating a degradation progression model based on a learning data, which includes an inspection interval information indicating period indicating an interval in which a structure was inspected, a first inspection record information indicating an inspection record of the structure, a service environment information indicating an environment in which the structure is provided, and a first soundness level information indicating the soundness of structure, associated with a structure identification (ID) to identify the structure of an object in the learning data;
estimating a second inspection record information and a second soundness level information corresponding to an interval, in which, inspection was not performed, by inputting into the degradation progression model, the first inspection record information, the service environment information, the first soundness level information and information indicating a past interval included in a generated data that was previously generated, and supplementing the generated data with the second inspection record information and the second soundness level information;
generating a prediction model for predicting a degradation index indicating a degradation state of the object at a specific point in time based on the first inspection record information, the second inspection record information, the first soundness level information and the second soundness level information; and
predicting a soundness level corresponding to a structure of an inspection object by inputting a prediction data including a latest inspection interval information, a latest inspection record information, a latest service environment information and a latest soundness level information, associated with a structure ID to identify the structure of the inspection object into the prediction model to predict a soundness level corresponding to the structure of the inspection object.

6. The non-transitory computer-readable recording medium according to claim 5,
wherein the degradation progression model is a Markov degradation hazard model that uses, as covariates, service state information that represents a service state of one or more structures included in the service environment information and damage state information that represents a damage state of the one or more structures included in the first inspection record information.

* * * * *